(12) United States Patent
Akil et al.

(10) Patent No.: US 8,159,018 B2
(45) Date of Patent: Apr. 17, 2012

(54) NON-VOLATILE MEMORY DEVICE

(75) Inventors: Nader Akil, Sterrebeek (BE); Prabhat Agarwal, Brussels (BE); Robertus T. F. Van Schaijk, Eindhoven (NL)

(73) Assignee: NXP B.V., Eindhoven (NL)

( * ) Notice: Subject to any disclaimer, the term of this patent is extended or adjusted under 35 U.S.C. 154(b) by 124 days.

(21) Appl. No.: 12/298,267

(22) PCT Filed: Apr. 19, 2007

(86) PCT No.: PCT/IB2007/051417
§ 371 (c)(1),
(2), (4) Date: Oct. 23, 2008

(87) PCT Pub. No.: WO2007/122567
PCT Pub. Date: Nov. 1, 2007

(65) Prior Publication Data
US 2009/0242964 A1    Oct. 1, 2009

(30) Foreign Application Priority Data
Apr. 26, 2006   (EP) .................................... 06113147

(51) Int. Cl.
*H01L 29/792* (2006.01)
*H01L 21/336* (2006.01)
*H01L 21/8239* (2006.01)
*H01L 21/8246* (2006.01)
*H01L 21/84* (2006.01)

(52) U.S. Cl. ................ 257/324; 257/347; 257/E29.309; 257/E21.423; 438/151; 438/164; 438/257; 438/261; 438/593

(58) Field of Classification Search .................. 257/324, 257/347, E29.309, E21.423; 438/164, 257, 438/261, 593, 151
See application file for complete search history.

(56) References Cited

U.S. PATENT DOCUMENTS

| 6,855,606 | B2 * | 2/2005 | Chen et al. ..................... 438/283 |
| 7,411,243 | B2 * | 8/2008 | Park et al. ..................... 257/315 |
| 2004/0166642 | A1 | 8/2004 | Chen |
| 2005/0029603 | A1 | 2/2005 | Yu |
| 2005/0145926 | A1 | 7/2005 | Lee |
| 2005/0173768 | A1 | 8/2005 | Lee et al. |
| 2005/0227435 | A1 | 10/2005 | Oh et al. |

(Continued)

FOREIGN PATENT DOCUMENTS
EP    1508926 A    2/2005
(Continued)

OTHER PUBLICATIONS

Oh, Chang Woo, et al; "Damascene Gate Finfet Sonos Memory Implemented on Bulk Silicon Wafer", IEDM 04-893, IEEE, 2004; pp. 36.6.1-36.6.4.

(Continued)

*Primary Examiner* — Mary Wilczewski

(57) ABSTRACT

A finFET-based non-volatile memory device on a semiconductor substrate includes source and drain regions, a fin body, a charge trapping stack and a gate. The fin body extends between the source and the drain region as a connection. The charge trapping stack covers a portion of the fin body and the gate covers the charge trapping stack at the location of the fin body. The fin body has a corner-free shape for at least ¾ of the circumference of the fin body which lacks distinct crystal faces and transition zones in between the crystal faces.

20 Claims, 8 Drawing Sheets

U.S. PATENT DOCUMENTS

2005/0266638 A1 12/2005 Cho

FOREIGN PATENT DOCUMENTS

WO 20051060000 A 6/2005

OTHER PUBLICATIONS

Hoffman, F, et al; "NVM Based on Finfet Device Structures"; ICMTD-2005; p. 149-152.

Yang, Fu-Liang, et al; "5NM-Gate Nanowire Finfet"; 2004 Symposium on VLSI Technology Digest of Technical Papers; 2004 IEEE; pp. 196-197.

Xiong, Weize, et al; "Improvement of Finfet Electrical Characteristics by Hydrogen Annealing" IEEE Electron Device Letters, vol. 25, No. 8; Aug. 2004; pp. 541-543.

* cited by examiner

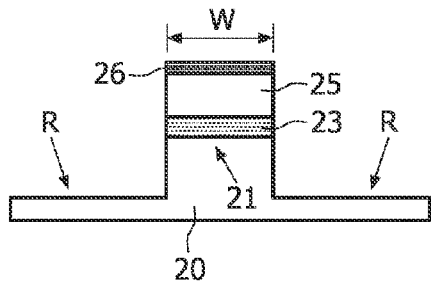
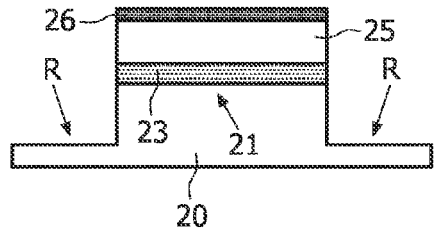
FIG. 13a     FIG. 13b
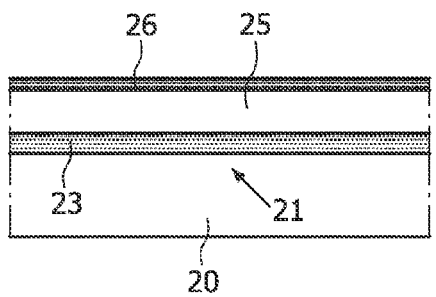
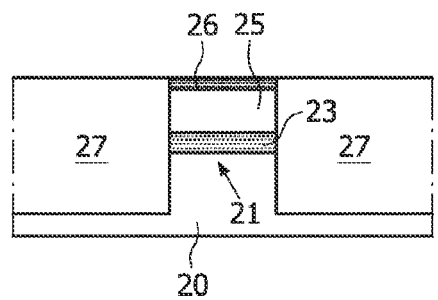
FIG. 13c     FIG. 14a
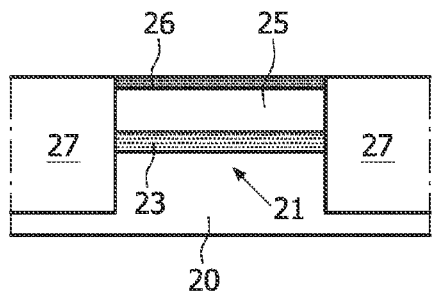
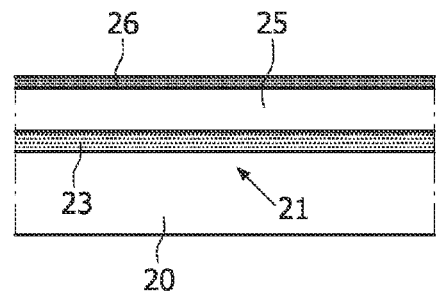
FIG. 14b     FIG. 14c

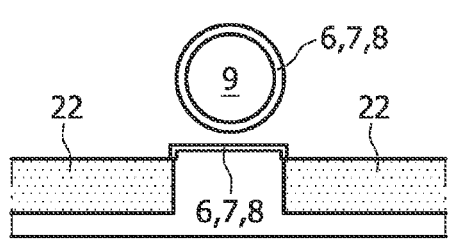
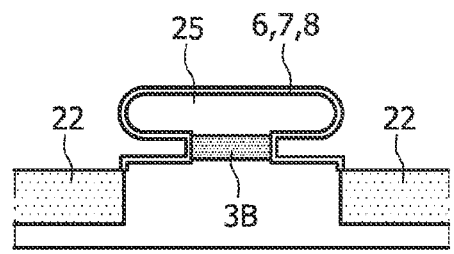
FIG. 16a  FIG. 16b
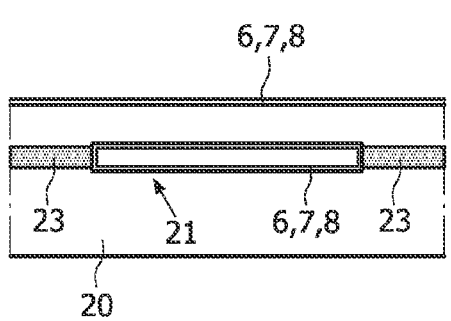
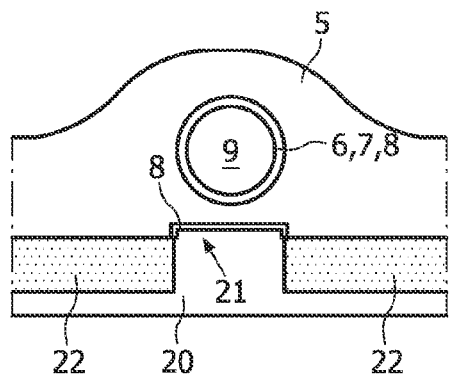
FIG. 16c  FIG. 17a
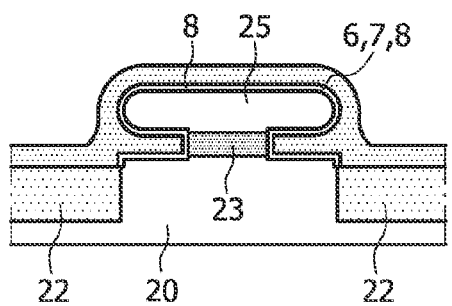
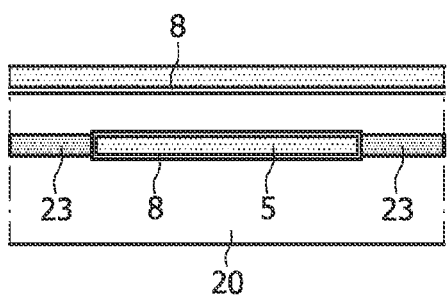
FIG. 17b  FIG. 17c

NON-VOLATILE MEMORY DEVICE

FIELD OF THE INVENTION

The present invention relates to a device for non-volatile memory applications. Also, the present invention relates to a method for manufacturing such a device. Moreover, the present invention relates to a memory array comprising such a device for non-volatile memory applications, and also to a semiconductor device comprising such a device for non-volatile memory applications.

BACKGROUND OF THE INVENTION

Charge trapping non-volatile memory devices (NVM devices) such as SONOS (silicon dioxide—silicon nitride—silicon dioxide—silicon) and SHINOS (silicon—high K—silicon nitride—silicon dioxide—silicon) memory devices are considered suitable candidates to enable flash memory devices in CMOS generation devices of the 45 nm node and smaller. SONOS and SHINOS memory devices exhibit relatively reduced program and erase voltages. Moreover, these devices are relatively easy to integrate with CMOS logic in case of embedded NVM devices.

Planar NVM devices, typically based on MOSFET devices, are hardly scaleable beyond the 45 nm node due to short channel effects. As known in the art, an improvement of device characteristics can be obtained by application of a finFET structure.

In a finFET, on top of an insulating layer a (relatively narrow) silicon line (a fin) is created between a source region and a drain region to serve as a channel. Next a line-shaped control gate is created which crosses the fin. Separated by a thin gate oxide film from the fin, the control gate surrounds (in cross-section) both the sidewalls and the top of the fin, which allows a relatively large field effect by the gate on the fin channel.

A finFET-based NVM device could comprise either a charge trapping stack such as for example either an ONO layer stack (silicon oxide—silicon nitride—silicon oxide) or a charge trapping layer stack of a high K material, a layer of silicon nitride and a layer of silicon dioxide. In such a charge trapping stack the silicon nitride layer is arranged for controllably holding electric charge.

Typically, the charge trapping stack could cover both the side walls and the top of the silicon fin.

The quality of SONOS non-volatile memory and generally, non-volatile memory based on charge trapping stacks is sensitive to the thickness of the bottom oxide layer adjacent to the channel region. The bottom oxide is usually a grown oxide which may have a superior quality over oxide layers that are formed by deposition. Typically, grown oxide has a lower density of defects, for example, pin holes.

Nevertheless, a small variation of the oxide thickness affects the tunneling of electrons through the bottom oxide significantly. The tunneling current of various tunneling mechanisms (e.g. direct tunneling, Fowler-Nordheim, modified Fowler-Nordheim) is known to exhibit an exponential dependency on the thickness of the bottom oxide. A small variation in the bottom oxide results in a significant variation of the charge injected into the nitride layer and hence in a variation of the threshold voltage (for programming or erasing).

Since charge can be localized in a nitride layer, a variation of bottom oxide thickness within a non-volatile memory cell can lead to local variations of trapped charge and to local variations of threshold voltage. When the bottom oxide thickness is not uniform over the channel region, this may result in a partly programmed cell area with a higher threshold voltage and a remaining (not programmed) cell area with a lower threshold voltage.

Clearly, this has undesirable effects on the characteristics of a finFET SONOS memory device, where the bottom oxide is grown after the formation of the fin and the fin has a number of crystal faces with edges (transition zones) that have different crystallographic orientations. This results in a programmed channel region with locally different threshold voltages; it may degrade the sub-threshold characteristics of a programmed non-volatile memory device, and makes the (electronic) programming window subject to significant variations.

SUMMARY OF THE INVENTION

It is an object of the present invention to provide a finFET non-volatile memory device in which variations of the electronic characteristics are reduced.

Various embodiments are directed to a finFET-based non-volatile memory device as defined in the claims.

Advantageously, as a result of the shape of the fin, a corner-free shape, virtually no distinct crystal surface layers on the fin are present. Basically, as a result of the adapted geometry, no discontinuous structures such as edges or transition zones between crystallographic planes occur. Thus, due to the absence of these transitional regions, any dependency of the growth rate of the bottom oxide on crystallographic orientation has been removed. The growth rate of the bottom oxide is therefore substantially uniform over the surface of the fin. As a consequence, the bottom oxide may exhibit less variation of its thickness (if any) and a charge trapping stack may therefore have more uniform tunneling characteristics.

In one aspect of the invention, the fin body is arranged on a silicon dioxide layer, and a surface of the silicon dioxide layer adjacent to the fin body is recessed to a recess level. Accordingly, by recessing the surface adjacent to the fin, a more complete coverage of the fin body by the charge trapping layer can be achieved.

In a further aspect of the invention, the recess level is either equal to or larger than the thickness of the charge trapping layer and the top insulator layer. Advantageously, the programming capability of the non-volatile memory device is improved, due to the fact that the gate can fully cover the charge trapping stack around the fin body.

Various embodiments of the present invention are directed to a method for manufacturing a finFET non-volatile memory device as defined in the claims.

In one aspect of the invention, the shaping of the fin body comprises annealing in hydrogen ambient at an elevated temperature between about 850 and about 1000° C. The annealing process advantageously achieves a reconstruction of the surface, yielding the corner-free shape of the fin body: the reconstructed (adapted) shape of the fin lacks distinct crystal faces and transition zones in between these crystal faces.

In a further aspect of the invention, the method provides an etching that is extended to a level where the insulating layer under the fin body is completely removed. Advantageously, a free-hanging fin body is obtained which can be fully encapsulated by the charge trapping stack material providing a maximal coverage. In this embodiment the charge trapping stack can be fully encapsulated by a control gate, consequently a substantially maximum coupling between control gate and charge trapping stack can be obtained.

Accordingly, a finFET non-volatile memory device is provided in which the fin body is free-standing.

Advantageously, this embodiment provides a maximal coverage of the channel region by the charge trapping stack.

Also, this embodiment allows to create a maximal coupling between the charge trapping stack and the gate, since the gate surrounds the charge trapping stack.

The present invention also relates to a memory array comprising at least one finFET non-volatile memory device as described above.

Furthermore, the present invention relates to a semiconductor device which comprises at least one finFET non-volatile memory device as described above.

BRIEF DESCRIPTION OF DRAWINGS

Embodiments of the invention will now be described, by way of example only, with reference to the accompanying schematic drawings in which corresponding reference symbols indicate corresponding parts, and in which:

In FIG. 2 gate 5 is not a continuous line in direction A-A', as it will be in case of a memory (the word line). This is also the case for FIGS. 1, 5, 6, 7.

FIGS. 13a, 13b, 13c show the finFET-based non-volatile memory device according to the third embodiment after a first manufacturing step;

FIGS. 14a, 14b, 14c show the finFET-based non-volatile memory device according to the third embodiment after a next manufacturing step;

FIGS. 16a, 16b, 16c show the finFET-based non-volatile memory device according to the third embodiment after a further manufacturing step;

FIGS. 17a, 17b, 17c show the finFET-based non-volatile memory device according to the third embodiment after yet a further manufacturing step;

DESCRIPTION OF EMBODIMENTS

Figure 1:
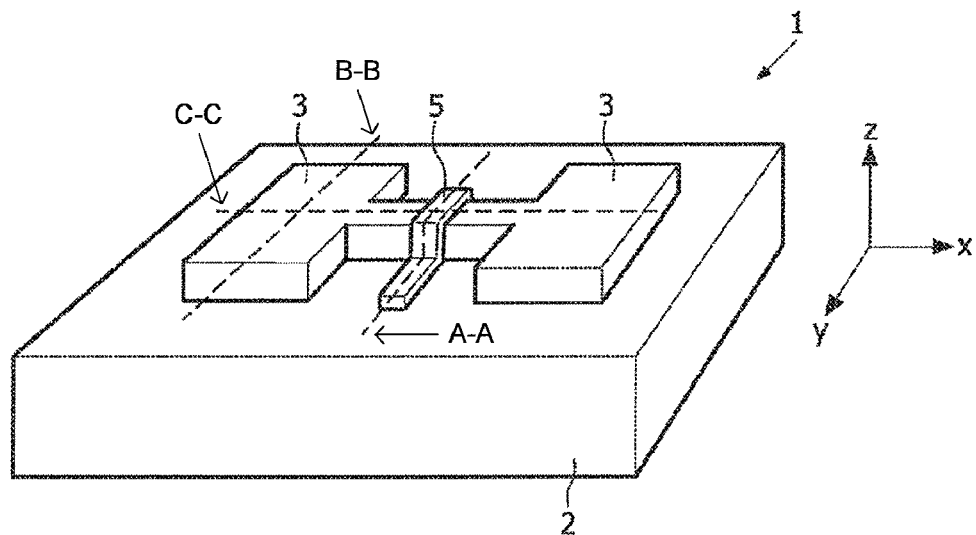
FIG. 1 shows a perspective layout of a finFET-based non-volatile memory device.

FIG. 1 shows a perspective layout of an embodiment of a finFET-based non-volatile memory device.

A finFET structure F is located in a monocrystalline silicon layer 1 on an insulating layer 2, for example a silicon dioxide layer or a BOX (buried oxide) layer of a SOI wafer (SOI: silicon on insulator).

The finFET structure F comprises source and drain regions 3 and a (relatively narrow) line or fin 4 which is located between the source and drain regions and 25 connects them. Source, drain regions 3 and fin regions 4 consist of silicon semiconductor material. The fin region 4 has a substantially rectangular cross-section with sidewall portions and a top portion.

A gate 5 is positioned on the insulating layer 2 between the source and drain regions 3 and extends over the fin 4 in the Y direction, substantially perpendicular to the length direction X of the fin 4. The gate 5 is separated from the fin 4 by a charge trapping stack (not shown) which can act as a memory element.

The gate 5 can be created by a deposition process in which a suitable mask is defined by lithography.

The gate material can be any suitable material such as doped poly-silicon or a metal.

A first cross-section is defined by line A-A, which is perpendicular to the linear direction X of the fin 4 (perpendicular to the first direction) and crosses the area of the charge trapping stack below the gate 5. A second cross-section is defined by line B-B, which is perpendicular to the linear direction X of the fin 4 and crosses the area of one source/drain region S.

A third cross-section is defined by line C-C which is parallel to the linear direction X of the fin 4 and extends across the area of one source/drain region S, the fin 4 and the other source/drain region D.

Typically, the length of the fin 4 under the gate 5 is between 30 and 50 nm, the width of the fin 4 is typically equal to or less than its length.

In this example the gate 5 is shown as a thin-layer line-shaped object, but it may be plate-shaped, depending on its height (direction Z) in comparison to the height of the fin 4. The gate is not a continuous line in the direction along line A-A. It is merely arranged to function in combination with a single fin 4.

Figures 2, 3:
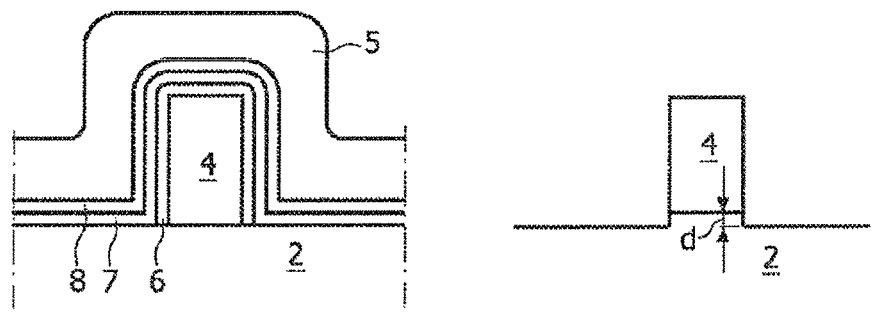
FIG. 2 shows a cross-sectional view of a prior art gate portion of the finFET-based non-volatile memory device of FIG. 1.
FIG. 3 shows a cross-sectional view of a gate portion of a finFET-based non-volatile memory device in accordance with the present invention, after a first manufacturing step.

FIG. 2 shows a cross-sectional view of a prior art gate portion of the finFET-based non-volatile memory device of FIG. 1 at the location of the gate.

The fin 4 is covered by the charge trapping stack comprising a bottom oxide layer 6, a charge holding silicon nitride layer 7 and a top insulating layer 8.

The charge trapping stack 6, 7, 8 is covered by the gate layer 5.

Typically, the first or bottom oxide layer 6 is grown on the surface of the fin 4, by an oxidation process. The silicon nitride layer 7 and the top insulating layer are deposited in subsequent steps.

The fin 4 has a substantially rectangular cross-section with relatively sharp edges and corners. Typically for a silicon fin, the top surface will be crystal faces which have a {100} orientation and the side wall surfaces which have a {110} orientation, whereas the corners of the fin (which extend as edges in the longitudinal direction of the fin 4) are substantially undefined as transitions between two adjacent crystal faces.

Due to a growth rate dependency of the bottom oxide layer 6 on the crystallographic orientation of the silicon surface of the fin, when a bottom oxide layer is grown on the fin, a different oxide thickness will be grown on the top and sidewall surfaces and hence a variation of the thickness of the bottom oxide layer 6 will occur on the corners of the fin 4.

As described above, a variation of the thickness of the bottom oxide layer may result in local variation of the tunneling probability and of charge injected into the nitride layer and hence in a variation of the threshold voltage (for programming or erasing).

FIG. 3 shows a cross-sectional view of a gate portion of a finFET-based non-volatile memory device in accordance with the present invention, after a first manufacturing step.

A fin 4 is created on an SOI (semiconductor-on-insulator) wafer. In a similar way to the prior art, a substantially rectangular fin 4 is formed on the buried oxide 2 of the SOI wafer.

The height of the rectangular fin 4 may be between about 50 and about 100 nm. The width of the rectangular fin 4 is between about 10 nm and 30 nm.

It is noted that due to an overetching the buried oxide 2 may be recessed with respect to the fin 4 (the recess level is indicated by arrow d).

Figure 4:
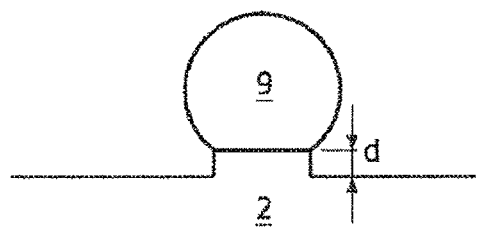
FIG. 4 shows a cross-sectional view of the finFET-based non-volatile memory device of FIG. 3, after a next manufacturing step.

FIG. 4 shows a cross-sectional view of the finFET-based non-volatile memory device according to the present invention, after a next manufacturing step.

To overcome the adverse effects of variations of the bottom oxide thickness, the present invention provides a fin body 9 of which the shape is corner-free, that is, the shape is adapted in such a way that at least at the fin body 9 distinct crystal faces (appearing as surface layers) and transition zones in between them are virtually lacking.

Due to a reconstruction of the surface, the adapted shape of the fin lacks distinct crystal faces and transition zones in between these crystal faces.

Basically, such an adapted shape has a rounded geometry, in which no discontinuities such as edges and corners between crystallographic planes occur.

In the cross-section perpendicular to the linear direction X of the fin 4, the rounded fin body 9 may have a substantially circular or elliptical shape.

Reconstructing the surface of the block-shaped or rectangular fin 4 into the adapted fin body 9 (i.e. rounding off the corners and edges of the fin 4 to form the rounded fin body 9) can be carried out by an annealing step in hydrogen ambient at elevated temperature (of about 850-1000° C.). For example, the gas ambient may be 100% hydrogen or may be a mixture of hydrogen with an inert carrier gas such as nitrogen or argon. A pressure between 5 and 500 torr (667-66700 Pa) may be used. Annealing time may be between 10 and 600 s.

During the annealing process the silicon atoms of the rectangular fin 4 are redistributed to form the rounded shape of the fin body 9.

In practice, the corner-free shape extends for at least about ⅔ of the circumference of the fin body, depending on the size of the rectangular fin 4. (For a fin 4 with square cross-section, the corner-free shape extends for about ¾ of the circumference.)

It is noted that the annealing steps can be done without masking, so also source and drain areas will be rounded. Since the source/drain regions have a thickness substantially equal or comparable to the height of the fin, the radius of the rounding of the source/drain regions will be similar to that of the fin. However, as the source/drain regions have a larger horizontal width than the fin, the main area of the source and drain regions remain flat. The rounding does not affect whatsoever the provision of contacts to these source/drain regions.

Figure 5:
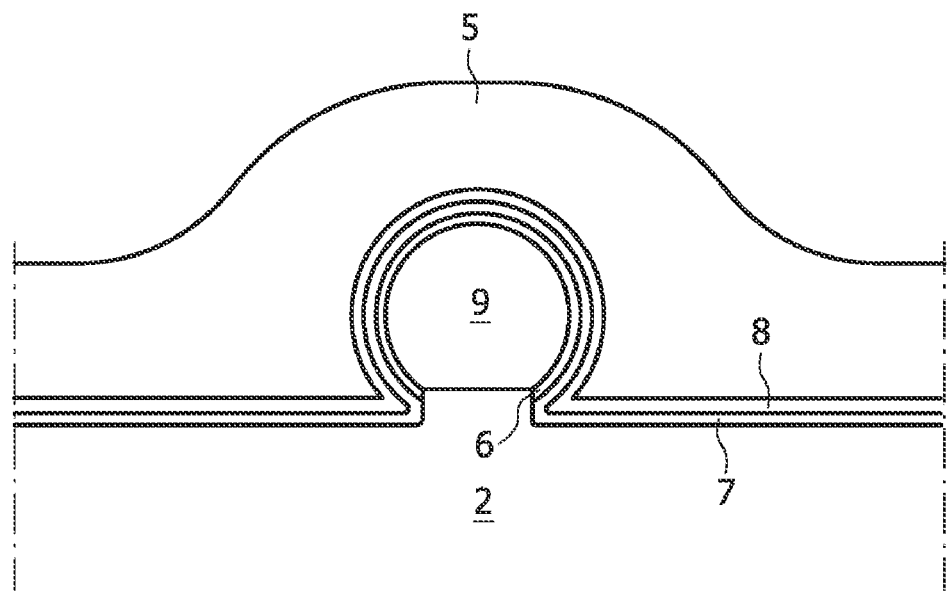
FIG. 5 shows a cross-sectional view of the finFET-based non-volatile memory device of FIG. 4, after a further manufacturing step.

FIG. 5 shows a cross-sectional view of the finFET-based non-volatile memory device 10 according to the present invention, after a further manufacturing step.

In a next step, a bottom oxide 6 is grown on the fin body 9. Due to the absence of discontinuous regions, such as edges and corners, any dependency on the growth rate of the bottom oxide 6 as a function of crystallographic orientation of the fin body 9 has been removed. The growth rate of the bottom oxide 6 is therefore substantially uniform over the surface of the fin body 9. In consequence, the bottom oxide may exhibit less variation of its thickness (if any).

Next, the charge holding layer 7 (typically silicon nitride) and the top insulating layer 8 are deposited over the rounded fin body 9.

The top insulating layer 8 may either be a silicon dioxide layer or layer of high-K material.

Thus, the charge trapping stack 6, 7, 8 comprises a bottom oxide layer 6, a charge holding silicon nitride layer 7 and a top insulator layer 8, the top insulator layer being at least one of a silicon dioxide layer and a high-K material layer.

A high-K material may comprise Hafnium-oxide $HfO_2$, Haffnium-silicate $Hf_xSi_{1-x}O_2$ ($0 \leq x \leq 1$), Hafnium-silicate-nitride HfSiON, Aluminum-oxide $Al_2O_3$ or Zirconium-oxide $ZrO_2$ material.

Moreover, the silicon nitride layer may be replaced by a high-K trapping material, e.g. a layer of silicon nano-crystals or a suitable high-K material layer.

Optionally, instead of the bottom oxide a different bottom insulating layer may be used such as a deposited layer like $Hf_xSi_{1-x}O_2$ with high silicon content.

The first or bottom oxide 6 has a thickness of about 2 nm. The silicon nitride layer 7 has a thickness of about 6 nm and a second or top insulating layer 8 has a thickness of about 8 nm. Subsequently, a gate 5 is formed on top of the charge trapping stack 6, 7, 8. The gate 5 typically comprises a poly-Si layer and is typically arranged to enclose the charge trapping stack 6, 7, 8.

The width of the gate (in the direction X) is about equal to the channel length. The thickness of the gate layer 5 is between about 10 and about 100 nm.

Figure 6:
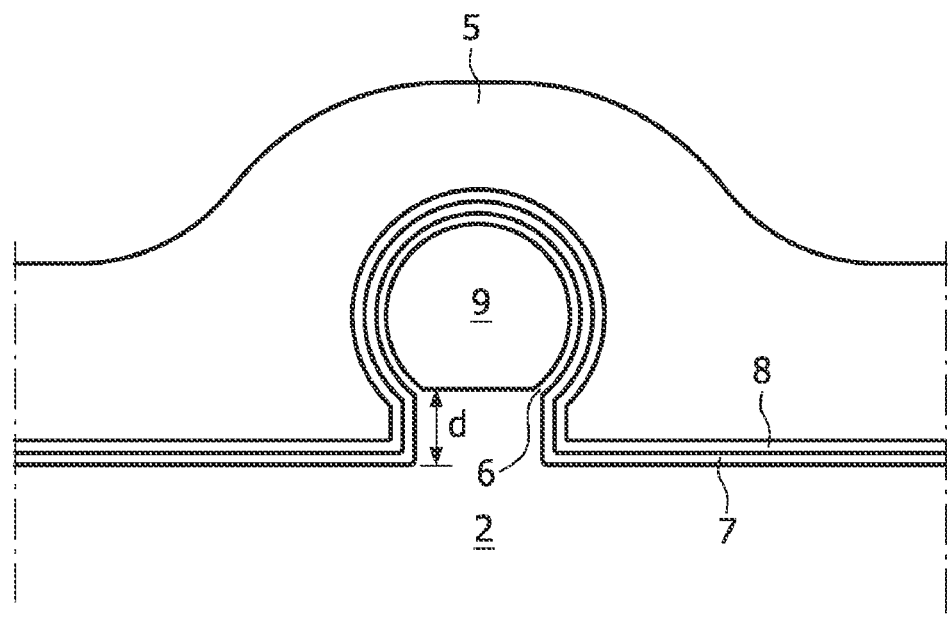
FIG. 6 shows a cross-sectional view of the finFET-based non-volatile memory device of FIG. 5 in an enhanced embodiment.

FIG. 6 shows a cross-sectional view of the finFET-based non-volatile memory device according to the present invention, in an enhanced embodiment.

It is noted that the finFET-based non-volatile memory device 10 as shown in FIG. 5 may show a sub-optimal programming capability due to the fact that the gate 5 does not sufficiently cover the charge trapping stack 6, 7, 8 near the surface of the buried oxide layer 2. Programming at this location near the surface of the buried oxide layer 2 may be effected by a fringing electric field, which can cause a localized relatively lower threshold voltage. As a result, leakage may occur at this location.

To overcome such a leakage, the finFET-based non-volatile memory device 10 is modified in that the recess level d is extended by extending the overetching during the formation of the rectangular fin 4.

Alternatively, after formation of the rectangular fin 4, an additional dry etching process can be carried out to etch the buried oxide 2 in order to extend the recess level d.

As appreciated by the skilled person, overetching may be limited depending on the anisotropy and/or the selectivity of the etching process.

By extending the recess level d to a height of substantially the thickness of the silicon nitride layer 7 and the second or top oxide layer 8 or more (say about 12 nm or more), the gate 5 can enclose the rounded fin body 9 and the charge trapping stack 6, 7, 8 more completely. Advantageously, the programming capability is improved due to the fact that the gate 5 fully covers the charge trapping stack 6, 7, 8 around the fin body 9.

Figure 7:
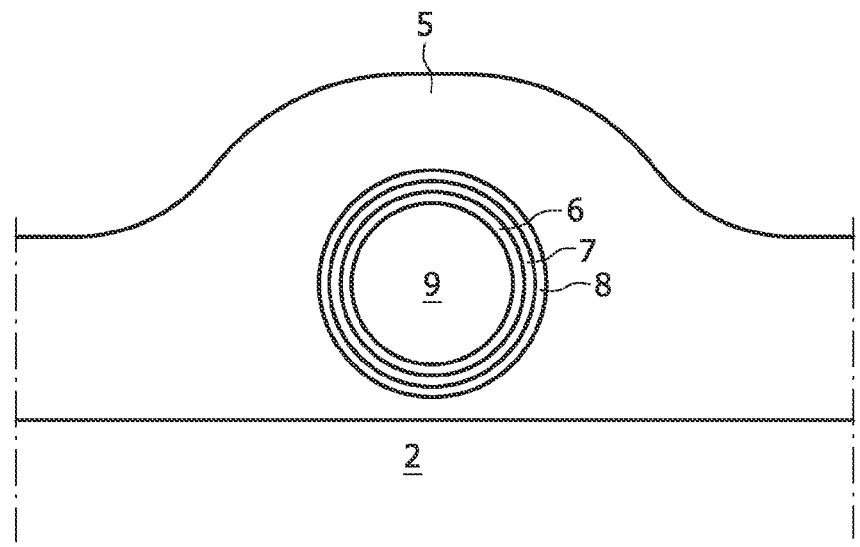
FIG. 7 shows a cross-sectional view of a second embodiment of the finFET-based non-volatile memory device.

FIG. 7 shows a cross-sectional view of a second embodiment of the finFET-based non-volatile memory device according to the present invention.

In FIG. 7 entities having the same reference number refer to identical entities as shown in the preceding Figures.

The cross-section of FIG. 7 is taken along a same line as line A-A, across the gate portion of the finFET-based memory device.

In this second embodiment, the finFET-based memory device is arranged on a monocrystalline surface layer of an SOI substrate.

The rounded fin body 9 is free-standing. That is, the circumference of the rounded fin body is not in direct contact with the insulator layer 2. Thus, the rounded fin body 9 can be completely surrounded by the charge trapping stack 6, 7, 8. The full circumference of the rounded fin body 9 is encompassed by the charge trapping stack 6, 7, 8. The charge trapping stack 6, 7, 8, itself is encompassed by the gate 5.

It is noted that the free hanging fin shown in FIG. 7 can be obtained by largely following the method as discussed above with regard to the first embodiment. Then, when the recess level d is extended (see FIG. 6), the etching is continued to a level where the silicon dioxide under the silicon fin is completely removed, allowing the fin to be free-hanging.

This extended etching process can be achieved by combining a first step of anisotropic dry etching to partly recess the oxide adjacent to the fin with a second step of isotropic dry etching, which removes the oxide below the fin. Alternatively, the second step may be a wet oxide etching process (e.g. with a HF solution).

To prevent release of the free hanging Si fin from the substrate, a same construction may be used as is explained below with regard to a finFET-based non-volatile memory device according to a third embodiment.

According to the first and second embodiments the finFET-based non-volatile memory device is formed on an SOI wafer, while in a third embodiment the finFET-based memory device is formed on a monocrystalline silicon substrate with a buried SiGe layer. Moreover, in accordance with the third embodiment, the fin is free-hanging as shown in FIG. 7. The method of forming the finFET-based non-volatile memory device according to the third embodiment will be illustrated below.

Figure 8:
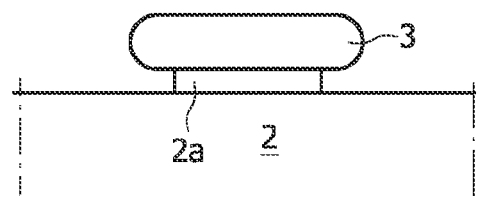
FIG. 8 shows a second cross-sectional view of the finFET-based non-volatile memory device according to the second embodiment.

FIG. 8 shows a second cross-sectional view of the finFET-based non-volatile memory device according to the second embodiment.

The cross-section of FIG. 8 is taken along a same line as line B-B, across the source/drain region 3, S, D of the finFET-based memory device.

The source/drain regions 3, S, D are formed in the monocrystalline silicon surface layer of the SOI substrate, which regions are block-shaped and relatively wider (W2>W) than the width of the rounded fin body 9 at the location of the gate 5.

Below the source/drain regions 3, S, D, the insulating layer 2 shows a recessed portion 2a. The recessed portion 2a is created due to the (partial) isotropy of the extended etching process as discussed with reference to FIG. 7.

Figure 9:
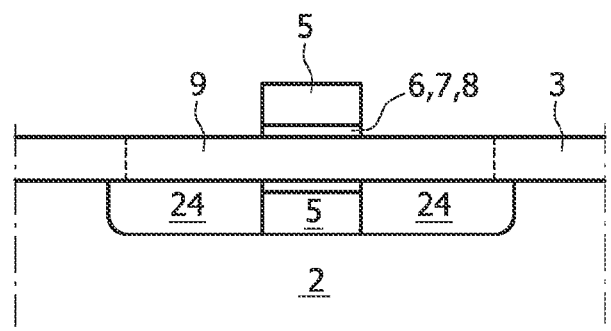
FIG. 9 shows a third cross-sectional view of the finFET-based non-volatile memory device according to the second embodiment.

FIG. 9 shows a third cross-sectional view of the finFET-based non-volatile memory device according to the second embodiment.

The cross-section of FIG. 9 is taken along a same line as line C-C, extending from one source/drain region S to the other source/drain region D.

The rounded fin body 9 connects the source/drain regions S, D with each other. Outside the region where the gate 5 and the charge trapping stack 6, 7, 8 are located, the rounded fin body 9 is separated from the surface of the insulating layer 2 by gap regions 24.

Figure 10:
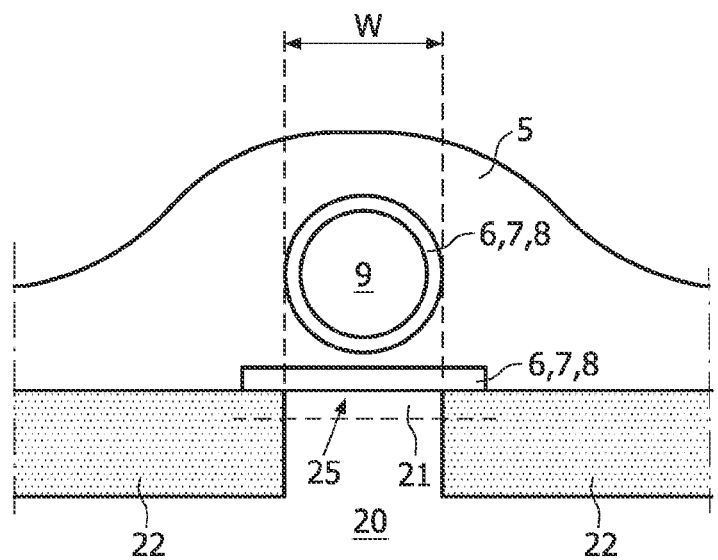
FIG. 10 shows a cross-sectional view of a third embodiment of the finFET-based non-volatile memory device.

FIG. 10 shows a cross-sectional view of a third embodiment of the finFET-based non-volatile memory device according to the present invention.

In FIG. 10 entities with the same reference number refer to identical entities as shown in the preceding Figures.

The cross-section of FIG. 10 is taken along a same line as line A-A, across the gate portion of the finFET-based memory device.

In this third embodiment, the finFET-based memory device is arranged on a monocrystalline surface layer of a semiconductor substrate 20.

The rounded fin body 9 is free-standing. That is, the circumference of the rounded fin body is not in direct contact with the substrate 20. Thus, the rounded fin body 9 can be completely surrounded by the charge trapping stack 6, 7, 8. The full circumference of the rounded fin body 9 is encompassed by the charge trapping stack 6, 7, 8. The charge trapping stack 6, 7, 8, itself is encompassed by the gate 5.

Between the gate 5 and the substrate 20, a second charge trapping stack 6, 7, 8 is present. In the silicon surface layer of the substrate 20, a block-shaped channel region 21 is defined.

The channel region 21 is arranged in between isolation regions 22.

The rounded fin body 9 and the block-shaped channel region 21 have substantially the same width W.

Figure 11:
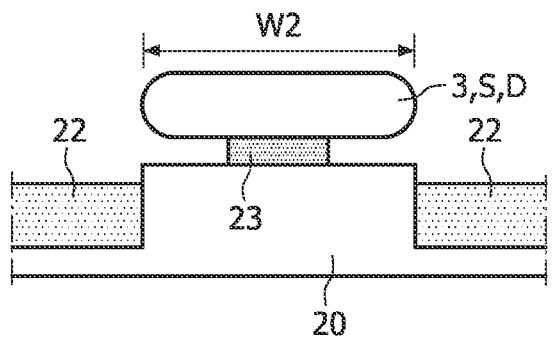
FIG. 11 shows a second cross-sectional view of the finFET-based non-volatile memory device according to the third embodiment.

FIG. 11 shows a second cross-sectional view of the finFET-based non-volatile memory device according to the third embodiment.

The cross-section of FIG. 11 is taken along a same line as line B-B, across the source/drain region 3, S, D of the finFET-based memory device.

On the monocrystalline silicon surface layer of the semiconductor substrate 20, which is block-shaped and relatively wider (W2>W) than the channel region 21 at the location of the gate 5 and the charge trapping stack 6, 7, 8 (cross-section A-A), residual epitaxial SiGe layers 23 are located (SiGe: silicon-germanium) in the source/drain regions 3, S, D.

The epitaxial SiGe layer 23 may have a thickness of about 50 nm.

The source/drain regions 3 are located on top of the residual epitaxial SiGe layers 23. The source/drain regions 3 are epitaxial with respect to the residual epitaxial SiGe layers 23 and the monocrystalline silicon surface layer of the semiconductor substrate 20.

At the cross-section B-B, the width W2 of the epitaxial source/drain region 3 is substantially larger than the width of the rounded fin body 4 at the location of the cross-section A-A.

Figure 12:
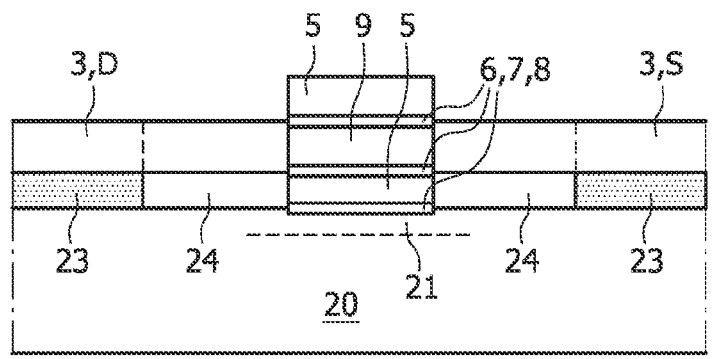
FIG. 12 shows a third cross-sectional view of the finFET-based non-volatile memory device according to the third embodiment.

FIG. 12 shows a third cross-sectional view of the finFET-based non-volatile memory device according to the third embodiment.

The cross-section of FIG. 9 is taken along a same line as line C-C, extending from one source/drain region S to the other source/drain region D.

The rounded fin body 9 connects the source/drain regions S, D with each other. Outside the region where the gate 5 and the charge trapping stack 6, 7, 8 are located, the rounded fin body 9 is separated from the surface layer of the substrate 20 by gap regions 24.

Below, a manufacturing process associated with this third embodiment is illustrated in more detail.

In the remaining FIGS. 13a, 13b, 13c-17a, 17b, 17c, all Figures denoted by a reference character 'a' relate to the first cross-section A-A, all Figures denoted by a reference character 'b' relate to the second cross-section B-B and all Figures denoted by a reference character 'c' relate to the third cross-section C—C.

In the second embodiment, the substrate 20 is typically a monocrystalline silicon wafer on which an epitaxial Si—Ge layer 23 is deposited. An epitaxial Si layer 25, which is covered by a capping layer 26 is formed on top of the SiGe layer 23. The capping layer 26 is typically a silicon nitride layer.

The capping layer 26 may typically have a thickness of about 20-30 nm to about 100 nm.

FIGS. 13a, 13b, 13c show the finFET-based non-volatile memory device according to the third embodiment after a first manufacturing step.

A mask (not shown) is provided so as to define a fin-shaped structure having a width W. The fin-shaped structure comprises the silicon surface layer 21, the epitaxial SiGe layer 23, the epitaxial silicon layer 25 and the capping layer 26.

Subsequently, the fin-shaped structure is created by etching recesses R flanking the fin-shaped structure. The recesses R extend into the semiconductor substrate 20 below the silicon surface layer 21.

FIGS. 14a, 14b, 14c show the finFET-based non-volatile memory device according to the third embodiment after a next manufacturing step.

In this processing step, silicon dioxide is deposited on the semiconductor substrate 20 to fill the recesses R as field oxide 27. Next, a chemical-mechanical polishing (CMP) step is carried out to level the silicon dioxide with the capping layer 26 that acts as stopping layer for the CMP step.

Figure 15A:
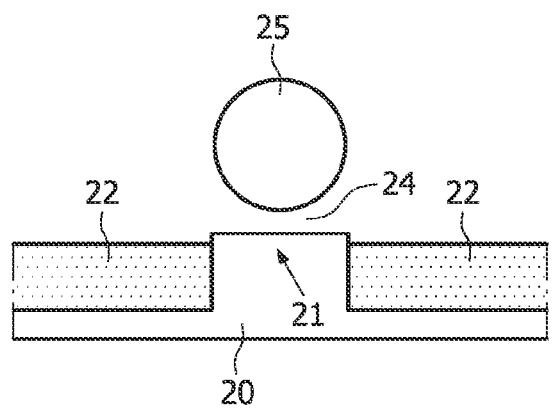
FIGS. 15a, 15b, 15c show the finFET-based non-volatile memory device according to the third embodiment after a subsequent manufacturing step.
Figure 15B:
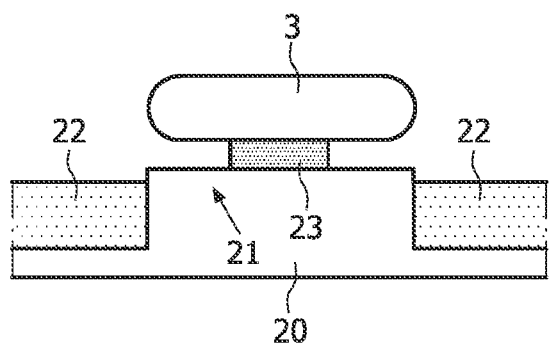
Figure 15C:
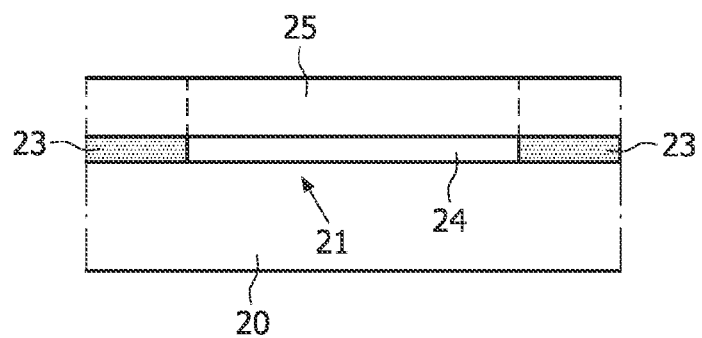

FIGS. 15a, 15b, 15c show the finFET-based non-volatile memory device according to the third embodiment after a subsequent manufacturing step.

In this manufacturing step, an etch-back of the field oxide 27 is carried out. The amount of silicon dioxide that is removed by the etch-back is such that the surface level of an etched field oxide 22 is below the level of the silicon surface layer 21. Subsequently, the capping layer 26 is removed by a selective etch.

Next, the epitaxial Si—Ge layer 23 is removed by a highly selective etching process. The etching process may be a dry etching process or a wet etching process.

The etching process is to be controlled so as to avoid overetching. The etching should only remove the epitaxial SiGe layer over an etch distance substantially equal to the width W of the fin-shaped structure defined earlier. By this process the epitaxial SiGe layer 23 below the epitaxial Si layer 25 acts as a sacrificial layer and is completely removed as shown in the cross-section A-A of FIG. 15a. At this stage, the beam-shaped epitaxial Si layer 25 in this cross-section is free-standing. The beam-shaped epitaxial Si layer 25 is separated from the silicon surface layer 21 by a gap region 24.

The control of the etching process is arranged to ensure that residual epitaxial SiGe layers 23 remain in the source/drain regions 3, S, D.

As shown in cross-section B-B of FIG. 15b, controlling the etching of the epitaxial Si—Ge layer 23 in this processing step allows that a residual epitaxial SiGe layer 23 remains below the epitaxial Si layer 3 in the source/drain region, since the width W2 of the source/drain region is larger than the width W of the epitaxial Si layer 25 at the location of cross-section A-A as described above.

Also, as shown in cross-section C—C of FIG. 15c, a residual epitaxial SiGe layer 23 remains below the epitaxial Si layer in the source/drain regions 3, since the width of the source/drain region 3 is larger than the width W of the epitaxial Si layer 25 at the location of cross-section A-A as described above.

It is noted that typically, a dry etching process for removal of SiGe comprises a fluorine-based chemistry.

FIGS. 16a, 16b, 16c show the finFET-based non-volatile memory device according to the third embodiment after a further manufacturing step.

In this manufacturing step, the free standing beam-shaped epitaxial Si layer 25 is rounded by means of an annealing step in hydrogen ambient at elevated temperature (of about 850-1000° C.). During this annealing process the silicon atoms of the free standing beam-shaped epitaxial Si layer 25 redistribute themselves to form the rounded shape of the fin body 9. In principle also the edges of the silicon S/D areas in FIG. 13 b are rounded.

After the annealing step to provide the rounded fin body 9, the charge trapping stack 6, 7, 8 is formed by subsequently growing a first or bottom oxide 6, then depositing a silicon nitride layer 7 and finally depositing a second or top oxide layer 8.

The first or bottom oxide layer 6 is grown thermally. The silicon nitride layer 7 and the second oxide layer 8 are formed by means of a respective chemical vapor deposition process.

It is noted that a second charge trapping stack is formed on the silicon surface layer 21 below the rounded fin body. Also, the surface of the epitaxial Si layer 25 at the location of the source/drain regions 3, is covered by the charge trapping stack 6, 7, 8.

Likewise, the surfaces of the residual epitaxial SiGe layer 23 that were exposed during the formation of the charge trapping stack 6, 7, 8, are covered by the charge trapping stack 6, 7, 8.

FIGS. 17a, 17b, 17c show the finFET-based non-volatile memory device according to the third embodiment after yet a further manufacturing step.

In this manufacturing step, a polysilicon layer 5 is deposited by chemical vapor deposition (CVD).

It is observed that chemical vapor deposition allows a conformal growth of the poly-Si layer 5. Filing of horizontal gaps such as gap regions 24 is achievable by CVD of poly-Si.

Figure 18A:
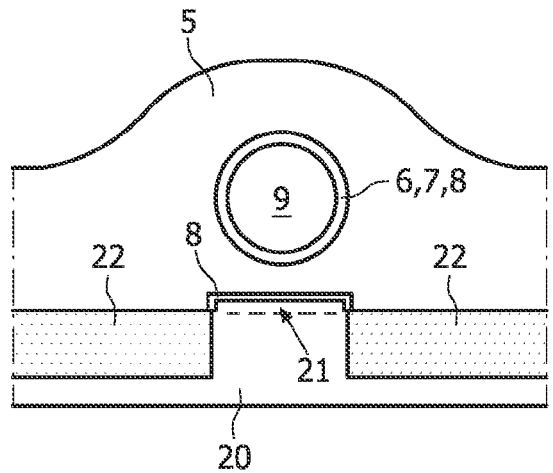
FIGS. 18a, 18b, 18c show the finFET-based non-volatile memory device according to the third embodiment after a further subsequent processing step in the first, second and third cross-sectional view, respectively.
Figure 18B:
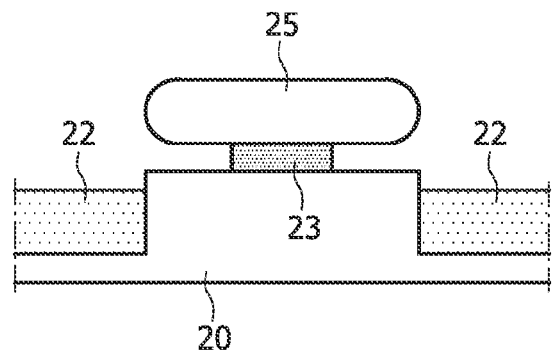
Figure 18C:
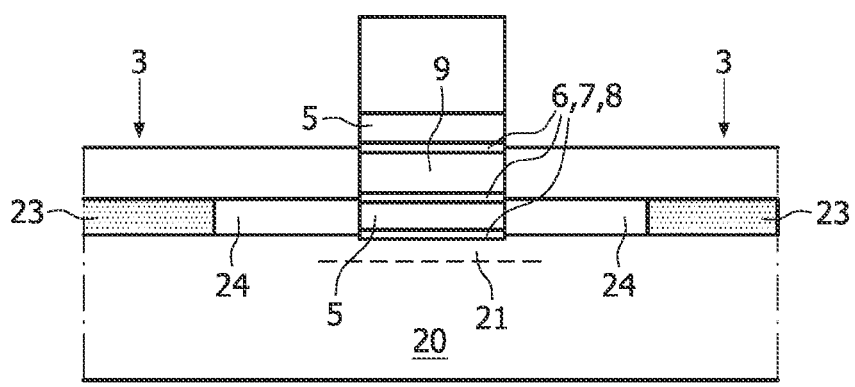

FIGS. 18a, 18b, 18c show the finFET-based non-volatile memory device after a further subsequent processing step in the first, second and third cross-sectional view, respectively.

A mask M1 is provided in the gate region to cover the polysilicon layer 5 at this location. Next, an etching process is applied to pattern the poly-Si layer 5 in such a way that the poly-Si layer 5 in the gate region remains intact. At the source and drain regions 3, S, D the poly Si layer 5 is removed by means of the etching process. Note that at the source/drain regions also the ONO stack 8 is removed by the poly-Si etching process.

It is further noted that in the space between the rounded fin body 9 and the monocrystalline silicon surface layer 21, i.e., outside the gate region as defined by the mask M1, the poly-Si layer 5 and the charge trapping stack 6, 7, 8 are removed from the gap regions 24.

After etching of the poly-Si layer, the (remainder of the) mask M1 may be removed.

The second and third embodiments provide a free-hanging rounded fin body which is covered by an ONO stack 6, 7, 8 with virtually uniform thickness and a virtually optimal coupling of the ONO stack and the rounded fin body 9.

Advantageously, the method to form the second embodiment is a relatively simple process of having a completely covered fin, simpler than the method of the third embodiment applied to a sacrificial SiGe layer 23.

By contrast, the third method may have the advantageous substrates with a buried SiGe layer which have lower cost than the SOI substrates that are used in the second embodiment.

Further, as known to persons skilled in the art, for each of the first, second and third embodiments, some additional processing steps can be carried out. The electronic properties of the source/drain regions 3 can be tuned by changing the dopant level of these regions by means of an implantation process. During back-end processing, a passivation layer may be deposited to cover the finFET structure; contacts to source/drain regions 3 and to the gate 5 may be created, and interconnect wiring may be provided by some metallization process(es).

It will be apparent to persons skilled in the art that other embodiments of the invention can be conceived and reduced to practice without departing form the true spirit of the invention, the scope of the invention being limited only by the appended claims as finally granted. The description is not intended to limit the invention.

The invention claimed is:

1. A method for manufacturing a finFET-based non-volatile memory device on a semiconductor substrate including source and drain regions, a fin body, a charge trapping stack and a gate; the fin body extending between the source region and the drain region, the fin connecting the source region and the drain region; the charge trapping stack being arranged to cover at least a portion of the fin body; the gate being arranged to cover the charge trapping stack at the location of the fin body, the method comprising:

forming the fin body with an entirely corner-free shape and on a gap defined by a lower surface of the fin body and an upper surface of an underlying substrate;

etching to provide a recess level that is either equal to, or larger than, the thickness of a layer of the charge trapping stack; and wherein:

the substrate comprises an insulating layer, which is covered by a monocrystalline silicon layer; the source and drain regions and the fin body being arranged in the monocrystalline silicon layer, the insulating layer adjacent to the source and drain regions and the fin body being recessed to a recess level;

the etching is extended to a level that the insulating layer under the fin body is completely removed; and the etching is achieved by combining a first anisotropic dry etching for partly recessing the insulating layer under the fin body with a second isotropic oxide etching for removing the insulating layer below the fin body.

2. A method for manufacturing a finFET-based non-volatile memory device, on a semiconductor substrate comprising source and drain regions, a fin body, a charge trapping stack and a gate; the fin body extending between the source region and the drain region, the fin connecting the source region and the drain region; the charge trapping stack being arranged to cover at least a portion of the fin body; the gate being arranged to cover the charge trapping stack at the location of the fin body, the method comprising:

forming the fin body with an entirely corner-free shape and on a gap defined by a lower surface of the fin body and an upper surface of an underlying substrate;

providing a gap region between a surface of the substrate and the fin body in such a way that the fin body is free-standing; and wherein the substrate comprises a monocrystalline silicon wafer which is covered by an epitaxial Si—Ge layer, the SiGe layer being covered by an epitaxial Si layer; the source and drain regions and the fin body being arranged in the epitaxial Si layer and wherein the provision of the gap regions comprises the removal of the epitaxial SiGe layer below the fin body.

3. A method for manufacturing a finFET-based non-volatile memory device, the method comprising:

providing a substrate having an epitaxial SiGe layer on a semiconductor wafer, and an epitaxial Si layer on the epitaxial SiGe layer;

forming a fin body in the epitaxial Si layer, the fin body extending between and connecting source and drain regions in the epitaxial Si layer;

removing a portion of the epitaxial SiGe layer below the fin body to form a gap region between a surface of the wafer and the fin body;

providing a charge trapping stack arranged to cover at least a portion of the fin body; and providing a gate arranged to cover a portion of the charge trapping stack.

4. The method of claim 3, wherein forming a fin body includes forming a rounded, substantially edge-free fin body.

5. A finFET-based non-volatile memory device, the device comprising:

a semiconductor wafer;

an epitaxial SiGe layer on the semiconductor wafer;

an epitaxial Si layer on the epitaxial SiGe layer;

source and drain regions in the epitaxial Si layer;

a fin body in the epitaxial Si layer, the fin body extending between and connecting the source and drain regions;

a gap region at discontinuity of the epitaxial SiGe layer between the fin body and the wafer, the gap region being defined by a surface of the wafer, a surface of the fin body and portions of the SiGe layer bordering the discontinuity;

a charge trapping stack arranged to cover at least a portion of the fin body; and a gate arranged to cover a portion of the charge trapping stack.

6. The device of claim 5, wherein the fin body has a rounded shape that is substantially edge-free.

7. A method for manufacturing a finFET-based non-volatile memory device on a semiconductor substrate including source and drain regions, a fin body extending between and connecting the source region and the drain region, a charge trapping stack being arranged to cover the fin body, and a gate being arranged to cover the charge trapping stack at the location of the fin body, the method comprising:

forming the fin body with an entirely corner-free shape and on a gap defined by a lower surface of the fin body and an upper surface of an underlying substrate, the substrate including an insulating layer covered by a monocrystalline silicon layer, the source and drain regions and the fin body being arranged in the monocrystalline silicon layer, the insulating layer adjacent to the source and drain regions and the fin body being recessed to a recess level; and etching to provide a recess level that is either equal to, or larger than, the thickness of a layer of the charge trapping stack, the etching being extended to a level that the insulating layer under the fin body is completely removed and is achieved by combining a first anisotropic dry etching for partly recessing the insulating layer under the fin body with a second isotropic oxide etching for removing the insulating layer below the fin body.

8. The method according to claim 7, wherein forming the fin body includes shaping the fin body by annealing the fin body in hydrogen ambient at an elevated temperature between about 850 and about 1000° C.

9. A method for manufacturing a finFET-based non-volatile memory device on a semiconductor substrate including:
- a monocrystalline silicon wafer which is covered by an epitaxial Si—Ge layer, the SiGe layer being covered by an epitaxial Si layer;
- source and drain regions, the source and drain regions and the fin body being arranged in the epitaxial Si layer;
- a fin body extending between and connecting the source region and the drain region;
- a charge trapping stack being arranged to cover at least a portion of the fin body; and
- a gate being arranged to cover the charge trapping stack at the location of the fin body;

the method comprising:
- forming the fin body with an entirely corner-free shape and on a gap defined by a lower surface of the fin body and an upper surface of an underlying substrate; and
- providing a gap region between a surface of the substrate and the fin body in such a way that the fin body is free-standing by removing the epitaxial SiGe layer below the fin body.

10. A finFET-based non-volatile memory device comprising:
- a substrate including a monocrystalline silicon wafer, an epitaxial SiGe layer on the monocrystalline silicon wafer, and an epitaxial Si layer on the epitaxial SiGe layer;
- source and drain regions formed in the epitaxial Si layer;
- a fin body being arranged in the epitaxial Si layer, extending between the source region and the drain region, and connecting the source region and the drain region;
- a channel in the substrate formed in the SiGe layer below the fin body, the channel forming a gap defined by a lower surface of the fin body and an upper surface of an underlying substrate in the channel, such that the fin body is free-standing over the gap;
- a charge trapping stack configured and arranged to cover at least a portion of the fin body and including a dielectric material in contact with the fin body at an interface therewith, the fin body having a cross section that is entirely corner-free; and
- a gate being arranged to cover a portion of the charge trapping stack over the fin body.

11. A finFET-based non-volatile memory device according to claim 10, wherein the fin body has a rounded, corner-free shape.

12. A finFET-based non-volatile memory device according to claim 10, wherein the fin body has a circular shape or an elliptical shape.

13. A Memory array comprising at least one finFET-based non-volatile memory device in accordance with claim 10.

14. A Semiconductor device comprising at least one finFET-based non-volatile memory device in accordance with claim 10.

15. A finFET-based non-volatile memory device according to claim 10, wherein the fin body is arranged over a silicon dioxide layer included in the substrate.

16. A finFET-based non-volatile memory device according to claim 13, wherein the charge trapping stack is formed around a circumference of the fin body; and
the gate is formed around the circumference of the charge trapping stack.

17. A finFET-based non-volatile memory device according to claim 10, further comprising a second charge trapping stack formed between the substrate and the fin body.

18. A finFET-based non-volatile memory device comprising:
- a source region and a drain region;
- a fin body extending between the source region and the drain region, the fin connecting the source region and the drain region;
- below the fin body, a gap defined by a lower surface of the fin body and an upper surface of an underlying substrate;
- a first charge trapping stack configured and arranged to cover at least a portion of the fin body and including a dielectric material in contact with the fin body at an interface therewith;
- a second charge trapping stack formed on the substrate, the first and second charge trapping stacks separated by the gap; and
- a gate being arranged to cover a portion of the charge trapping stack over the fin body.

19. A finFET-based non-volatile memory device of claim 18: wherein the gate fills the gap region.

20. A finFET-based non-volatile memory device of claim 18, wherein the fin body has a cross section that is entirely corner-free.

* * * * *